(12) United States Patent
Friend et al.

(10) Patent No.: US 6,429,601 B1
(45) Date of Patent: Aug. 6, 2002

(54) ELECTROLUMINESCENT DEVICES

(75) Inventors: Richard H. Friend; Jeremy H. Burroughes, both of Cambridge (GB); Mutsumi Kimura, Suwa (JP); Stephen K. Heeks, Cottenham (GB)

(73) Assignee: Cambridge Display Technology Ltd., Cambridge (GB)

( * ) Notice: Subject to any disclaimer, the term of this patent is extended or adjusted under 35 U.S.C. 154(b) by 0 days.

(21) Appl. No.: 09/641,229

(22) Filed: Aug. 17, 2000

Related U.S. Application Data

(63) Continuation of application No. PCT/GB99/00383, filed on Feb. 5, 1999.

(30) Foreign Application Priority Data

Feb. 18, 1998 (GB) .............................................. 9803441

(51) Int. Cl.⁷ ................................................. G09G 3/32
(52) U.S. Cl. ....................... 315/169.3; 345/76; 345/82; 313/505
(58) Field of Search ........................... 315/169.3, 169.1, 315/169.2; 313/500–505; 345/76, 55, 82; 257/59, 72

(56) References Cited

U.S. PATENT DOCUMENTS

| | | | |
|---|---|---|---|
| 4,074,318 A | 2/1978 | Kapes, Jr. .................... | 358/230 |
| 4,539,507 A | 9/1985 | VanSlyke et al. ........... | 313/504 |
| 5,235,253 A | * 8/1993 | Sato ......................... | 315/169.3 |
| 5,684,365 A | * 11/1997 | Tang et al. ............... | 315/169.3 |
| 5,714,968 A | 2/1998 | Ikeda ......................... | 345/77 |
| 5,923,309 A | * 7/1999 | Ishizuka et al. .............. | 345/82 |
| 6,099,980 A | * 8/2000 | Schoo et al. ................. | 428/690 |
| 6,157,356 A | * 12/2000 | Troutman .................... | 345/82 |

FOREIGN PATENT DOCUMENTS

| | | |
|---|---|---|
| EP | 0 595 792 A2 | 5/1994 |
| EP | 0 762 374 A1 | 3/1997 |
| JP | 58-220185 | 12/1983 |
| JP | 7-122360 | 5/1995 |
| WO | WO 99/12150 | 3/1999 |

OTHER PUBLICATIONS

"Photoconductive Polymers", Encyclopedia of Chemical Technology, Fourth Edition, vol. 18, p. 857.

* cited by examiner

*Primary Examiner*—Haissa Philogene
*Assistant Examiner*—Ephrem Alemu
(74) *Attorney, Agent, or Firm*—Marshall, Gerstein & Borun.

(57) ABSTRACT

An organic light-emitting device having an organic light-emitting region comprising a plurality of organic light-emitting pixels; switch means each associated with a respective pixel for switching power to that pixel; and drive means for driving each switch means to cycle between a first, low power mode and a second, high power mode, at a frequency sufficient to cause light emission from the associated pixel to appeal substantially continuous, the duration of the high-power mode relative to the low power mode being variable so as to vary the average brightness of the pixel.

19 Claims, 4 Drawing Sheets

ELECTROLUMINESCENT DEVICES

CROSS-REFERENCE TO RELATED APPLICATION

This is a continuation of International Application No. PCT/GB99/00383 filed Feb. 5, 1999, the entire disclosure of which is incorporated herein by reference.

BACKGROUND OF THE INVENTION

1. Field of the Invention

This invention relates to electroluminescent devices, especially ones that use an organic material for light emission and have thin-film transistors for switch circuitry.

2. Description of Related Technology

One type of electroluminescent device is described in PCT/WO90/13148, the contents of which are incorporated herein by reference. The basic structure of this device is a light-emitting polymer film (for instance a film of a poly(p-phenylenevinylene)—"PPV") sandwiched between two electrodes, one of which injects electrons and the other of which injects holes. The electrons and holes excite the polymer film, emitting photons. These devices have potential as flat panel displays.

Another type of organic light-emitting device is a small molecule device, details of which are given in U.S. Pat. No. 4,539,507, the contents of which are incorporated herein by reference. These have a light-emitting layer which comprises at least one small molecule material such as tris(8-hydroxyquinoline)aluminium ("$Alq_3$") sandwiched between the two electrodes.

In an organic light-emitting device the organic light-emitting layer is generally divided into individual pixels, which can be switched between emitting and non-emitting states by altering the current flow through them. The pixels are generally arranged in orthogonal rows and columns. Two alternative arrangements for controlling the pixels are generally used: passive matrix and active matrix. In a passive matrix device one of the electrodes is patterned in rows and the other in columns. Each pixel can be caused to emit light by applying an appropriate voltage between the row and column electrodes at whose intersection it lies. In an active matrix display circuitry is provided so that each pixel can be left in an emitting state whilst another pixel is addressed.

FIG. 1 illustrates a circuit for driving one pixel in a thin-film transistor ("TFT") active matrix display. The circuit comprises the pixel itself, illustrated as diode 1, which is connected between electrodes 2 and 3. Electrodes 2 and 3 are connected to all the pixels of the device and a voltage sufficient for emission from the pixel is applied constantly between the electrodes 2 and 3. At least part of the switch circuit 4, which in practice is embodied by thin-film transistors, lies between electrode 3 and the pixel 1. The switch circuit is controlled by way of row and column electrodes 5, 6. To cause the pixel 1 to emit light, voltages are applied to the electrode 6, to switch the switching transistor 7 on, and to electrode 5 to charge the storage capacitor 8. Electrode 6 is then turned off. Since the capacitor 8 is charged the current transistor 9 is switched on and the voltage applied at electrode 3 is applied to the pixel, causing it to emit. Although it requires a more complex circuit than a passive matrix device this arrangement has the advantage that the pixel can be held in an emitting state by means of the capacitor 8 whilst other pixels on different rows and columns are addressed by their row and column electrodes. Using the whole backplane area for thin film transistors and metal lines is well known in transparent and reflective LCD displays.

To allow clearer images to be displayed it is important to be able to control the brightness of each pixel individually, so as to provide a grey-scale. In the active matrix device of FIG. 1 this is done by selecting the voltage applied to electrode 5 and the duration of the pulse applied to electrode 6 so as to fix the charge applied to capacitor 8. The charge on capacitor 8 determines the state of transistor 9 and therefore the current flow to the pixel from electrode 3. The current flow through the pixel determines the brightness of its emission. FIG. 2 shows a graph of current through transistor 9 (I) against gate voltage of transistor 9 (V). There is a flat "off" zone 100 where the current and voltage are low and no light is emitted by pixel 1, a sloping transition zone 110 providing intermediate levels of brightness from the pixel 1 and a flat "on" zone 120 where the transistor is in its fully on state and the pixel is fully on. By fixing the charge on capacitor 8 so that the transistor 9 is at the desired point in the transition zone a desired intermediate level of brightness for the pixel can be achieved.

The shape of the curve in FIG. 2 is determined by the characteristics of the circuit elements, especially current transistor 9. A switch circuit 4 must be provided for every pixel of the display. To achieve the required miniaturisation and low cost the circuit is integrated with the display. However, this arrangement generally leads to great variability of performance between the current transistors of each pixel of the display. Although the current flow in the off and on zones is fairly consistent between current transistors (because the off-current is almost zero and the on-current is largely determined by the resistance of the diode 1), the current transistors' threshold voltages can differ greatly. This is a particular problem where the light-emitting material of the display is an organic light-emitting material because the amount of light emitted from organic light-emitting pixels is sensitively dependent on the current through the device. Therefore, for the same input line current different organic light-emitting pixels can produce widely differing intermediate brightnesses. This limits the use of this drive scheme for grey-scale organic light-emitting display devices.

SUMMARY OF THE INVENTION

According to a first aspect of the invention there is provided an organic light-emitting having: an organic light-emitting region comprising a plurality of organic light-emitting pixels; first switch means each associated with a respective pixel for switching power to that pixel; and drive means for driving each switch means between a first, low power mode and a second, high power mode, at a frequency sufficient to cause light emission from the associated pixel to appear substantially continuous, the duration of the high power mode relative to the low power mode being variable so as to vary the average brightness of the pixel over the duration of a cycle, wherein in each cycle the high power mode is provided as more than one discrete high power pulse.

According to a second aspect of the invention, the organic light-emitting device may comprise: an organic light-emitting region comprising a plurality of organic light-emitting pixels, each pixel comprising at least two independent light-emitting areas, wherein the light-emitting areas are of different areas; a switch arrangement associated with each pixel and comprising switch means each associated with a respective light-emitting area of that pixel for switching power to that light-emitting area; and a control means for addressing each pixel by its associated switch arrangement and controlling the brightness of each pixel by selectively driving one or more of the corresponding switch means to cause selected ones of the light-emitting areas of that pixel to emit light.

BRIEF DESCRIPTION OF THE DRAWINGS

The invention will now be described by way of example with reference to the accompanying drawings, in which.

DETAILED DESCRIPTION OF PREFERRED EMBODIMENTS

Figure 1:
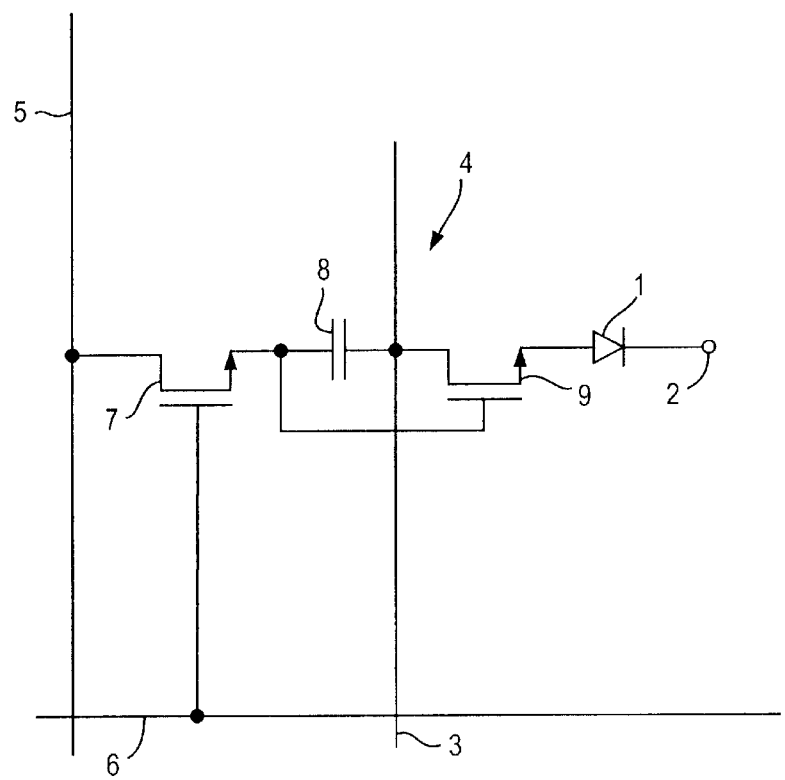
FIG. 1 shows a circuit for driving one pixel in a thin-film transistor ("TFT") active matrix display.

According to a first aspect of the present invention there is provided an organic light-emitting device having: an organic light-emitting region comprising a plurality of organic light-emitting pixels; switch means each associated with a respective pixel for switching power to that pixel; and drive means for driving each switch means to cycle between a first, low power mode and a second, high power mode, at a frequency sufficient to cause light emission from the associated pixel to appear substantially continuous, the duration of the high power mode relative to the low power mode being variable so as to vary the average brightness of the pixel.

Each switch means suitably comprises at least one transistor. That transistor is preferably controlled by a gate voltage to switch power through the transistor and to the pixel. In the first mode the transistor preferably blocks current flow to the associated pixel so that pixel is substantially non-emissive. In the second mode the transistor preferably allows current flow to the associated pixel so that the pixel is substantially fully emissive. In the second mode the transistor is preferably in its fully on state. In the first mode the transistor is preferably in its fully off state.

Preferably in one or both of the first and second modes the brightness of the pixel is substantially insensitive to the transistor's characteristics, for example the gate voltage—so that small changes in the gate voltage do not substantially affect the through current to the pixel. The transistor is preferably a thin-film transistor.

The switch means preferably comprises a charge storage means (e.g. a capacitor), suitably connected to the gate of the transistor described above, for holding the transistor in the first mode or the second mode. The charge storage means is suitably charged by means of a second transistor, preferably a thin-film transistor. The switch means is preferably a thin-film transistor switch means.

The display is preferably an active matrix display, most preferably a TFT active matrix display.

The frequency of switching between the first and second modes is suitably greater than 30 Hz, preferably greater then 50 Hz and most preferably around 60 Hz or greater.

The drive means is preferably controllable to vary the duration of the high power mode relative to the low power mode. The duty cycle of the drive scheme (as measured by the duration of the second mode as a proportion of the total cycle time) may vary from zero (when the pixel is off) to 100% (maximum brightness).

In each cycle the high power mode may be provided as one or more than one discrete high power pulse Each pixel may suitably comprise at least two independent light-emitting areas, with a switch means associated with each one of the light-emitting areas for independently switching power to that light-emitting area under the control of the drive means.

The organic light-emitting device may comprise: an organic light-emitting region comprising a plurality of organic light-emitting pixels, each pixel comprising at least two independent light-emitting areas; a switch arrangement associated with each pixel and comprising switch means each associated with a respective light-emitting area of that pixel for switching power to that area; and a control means for addressing each pixel by its associated switch arrangement and controlling the brightness of each pixel by selectively driving one or more of the corresponding switch means to cause selected ones of the light-emitting areas of that pixel to emit light.

Where each pixel is divided into separate light-emitting areas the light-emitting areas of each pixel are suitably of different sizes, preferably of different areas. Preferably, in each pixel, every light-emitting area (except the smallest) is twice (or substantially twice) the size of the next-largest light-emitting area of that pixel.

The drive means is preferably capable of driving each pixel or each light-emitting area to operate non-instantaneously at an intermediate voltage, to allow further control over the brightness of the pixel. Therefore, the drive means is suitably capable of driving the switch means to a non-instantaneous partially on state. The partially on state may be a third, intermediate power mode. Other intermediate power modes may also be provided.

Preferred thicknesses for the pixels and/or light-emitting region are in the range from 20 to 200 nm and most preferably around 100 nm.

The organic light-emitting pixels and/or areas are suitably formed of a light-emitting polymer material, and preferably of a conjugated material. A suitable material is a semiconductive conjugated polymer such as PPV or a derivative thereof. The light-emitting material of which the pixels and/or light-emitting areas are formed suitably is or comprises PPV, poly(2-methoxy-5(2'-ethyl)hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related copolymers. It could be deposited by spin-coating, dip-coating, blade-coating, meniscus-coating, self-assembly etc. The constituent of the light-emitting region and/or its precursor may be water-based: examples are precursor-based PPVs. An alternabve material is an organic molecular light-emitting material, e.g. $Alq_3$, or any other small sublimed molecule or conjugated polymer electroluminescent material as known in the prior art.

The organic light-emitting pixels and/or areas are suitably deposited by ink-jet printing.

To improve the performance of the device a conductive polymer layer may be provided adjacent to the light-emitting region. The conductive polymer layer preferably comprises polyethylene dioxythiophene ("PEDT"), polystyrene sulphonic acid doped polyethylene dioxythiophene ("PEDT-PSS"), doped polyaniline, a doped alkylthiophene and/or a doped polypyrrole. The thickness of the layer is suitably less than 200 nm, preferably less than 100 nm and most preferably less than or around 50 nm. The sheet resistance of the layer is suitably greater than $10^6$ or $10^7$ Ohms/square, preferably greater than $10^8$ Ohms/square and most preferably greater than or around $10^{10}$ Ohms/square.

Figure 3:
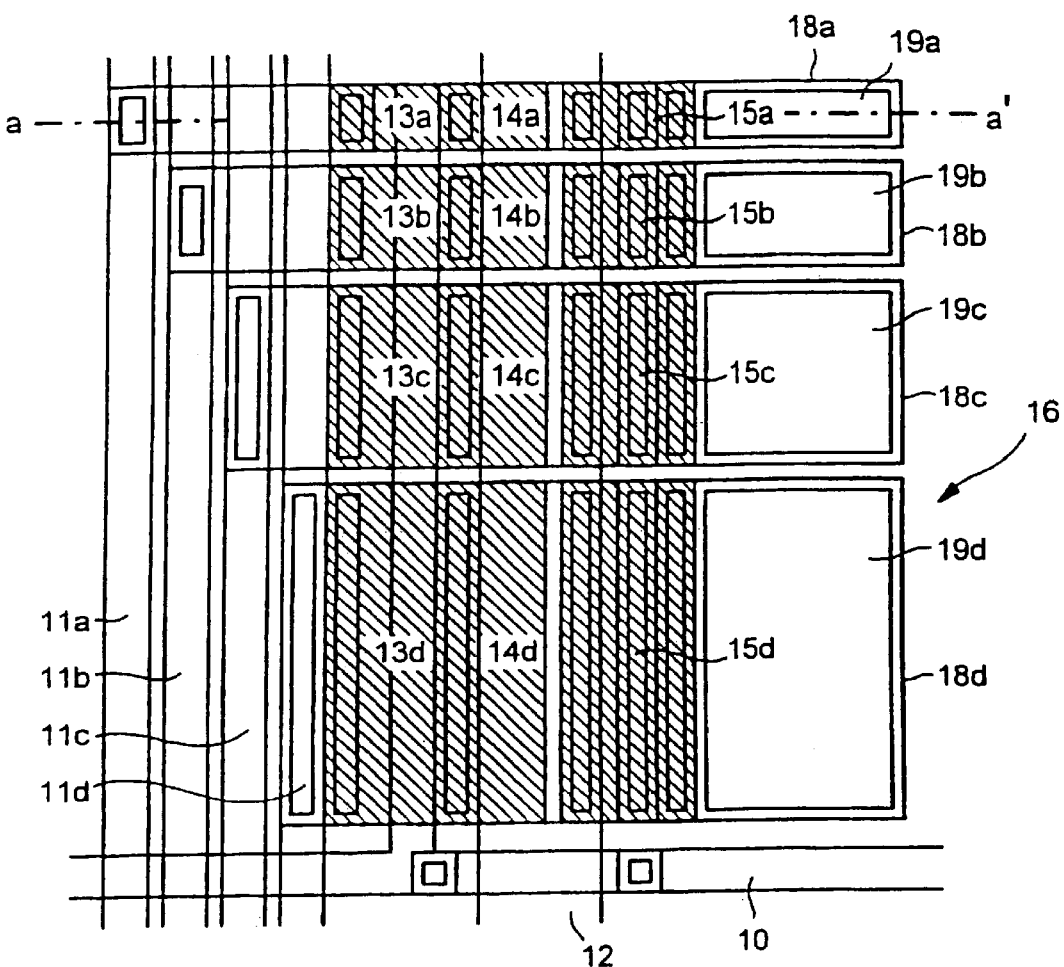
FIG. 3 shows a plan view of the switching circuitry associated with pixels of an organic light-emitting device.
Figure 4:
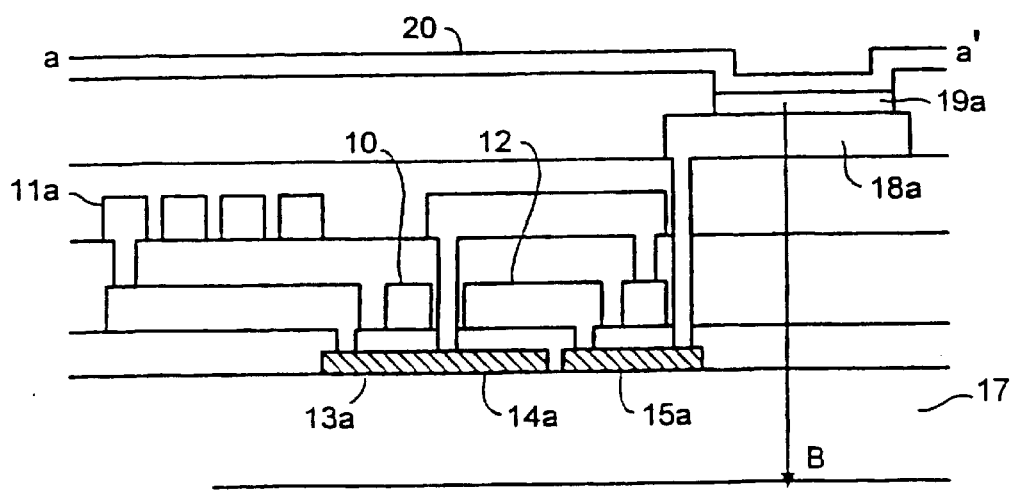
FIG. 4 shows a cross-section of the circuitry of FIG. 3 on line a–a'.
Figure 5:
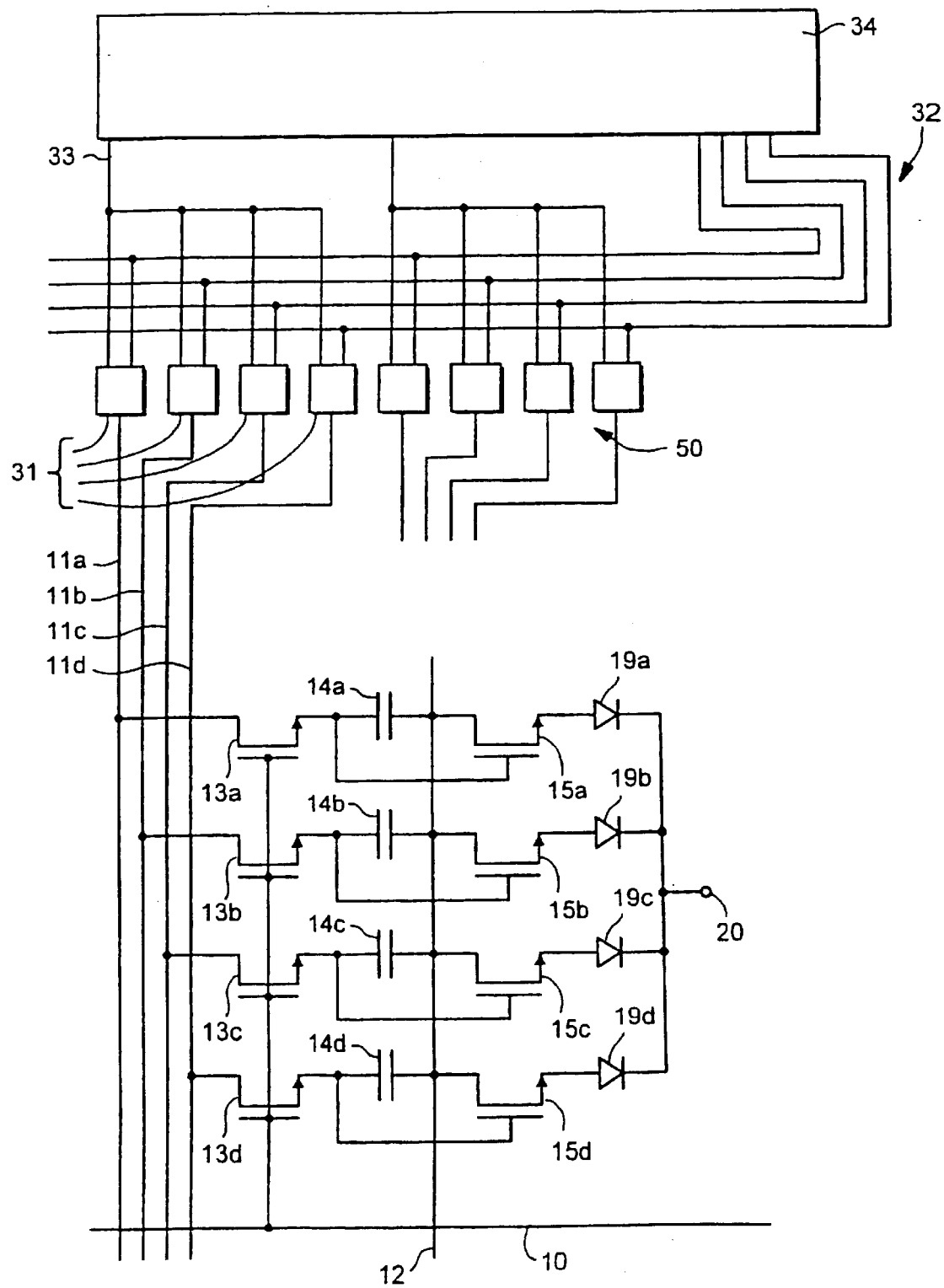
FIG. 5 shows a circuit diagram of the device of FIGS. 3 and 4.

FIGS. 3 to 5 show the TFT circuitry associated with a pixel 16 of an organic light-emitting display device. The light emitting material of the pixel is divided into four light-emitting areas 19a–d. The TFT circuitry comprises a common line 12 (which corresponds to the electrode 3 in FIG. 1) and a scan line 10 (which corresponds to the electrode 6) which are shared by the light-emitting areas 19a–d and other circuitry which is provided for each area individually. Each light-emitting area has a signal line 11a–d (which corresponds to the electrode 5 in FIG. 1), a switching transistor 13a–d (which corresponds to the transistor 7 in FIG. 1), a storage capacitor 14a–d (which corresponds to the capacitor 8 in FIG. 1) and a current transistor 15a–d (which corresponds to the transistor 9 in FIG. 1). Insulating regions of $SiO_2$, shown in FIG. 4, separate the component parts of the circuitry, and the circuitry is deposited on a glass substrate 17. At the outputs of transistors 15a–d are electrode pads 18a–d (see 18a in FIG. 4) of transparent indium-tin oxide ("ITO") to form the anodes of the emitting device. The organic light-emitting material of the pixel is deposited on the pad in four separate sections (see 19a–d in FIG. 4) and a common cathode 20 (corresponding to electrode 2 in FIG. 1) is deposited on top of those sections. Light emission from the pixel towards a viewer is generally in the direction into the page in FIG. 3 and as shown by arrow B in FIG. 4.

The scan, signal and common lines are controlled by control units 31, 34 (FIG. 5). In an alternative embodiment each light-emitting area 19a–d could be provided with an individual line equivalent to common line 12, each individual line being controlled independently by the control units.

The pixel of FIGS. 3 to 5 forms part of a larger light-emitting device in which several thousand such pixels are arranged in orthogonal rows and columns. For instance, one typical size is 800 columns by 600 rows, giving a total of 480,000 pixels. The device could even be a colour display device having equal numbers of red, green and blue pixels. The additional units 50 in FIG. 5 are for controlling another pixel.

To manufacture the device the TFT circuitry is first deposited on to the glass substrate 17 in the normal way. Then the organic light-emitting material is deposited on the ITO pads 18d etc. The organic light-emitting material in this example is PPV. The PPV could be deposited as a layer over the entire device (e.g. by spin-coating a precursor polyrner) and then patterned to form individual pixels or areas of pixels, or the pixels/areas could be deposited individually (e.g. by ink-jet printing), especially when forming a multi-colour (e.g. red/green/blue) device with pixels which each emit different colours of light. The resulting pixels are around 1000 Å thick.

To deposit the light-emitting material by ink-jet printing the material is sprayed through an ink-jet printer spray head. A suitable spraying cycle is 14,400 drops per second, with a drop volume of 30 pl.

Figure 6:
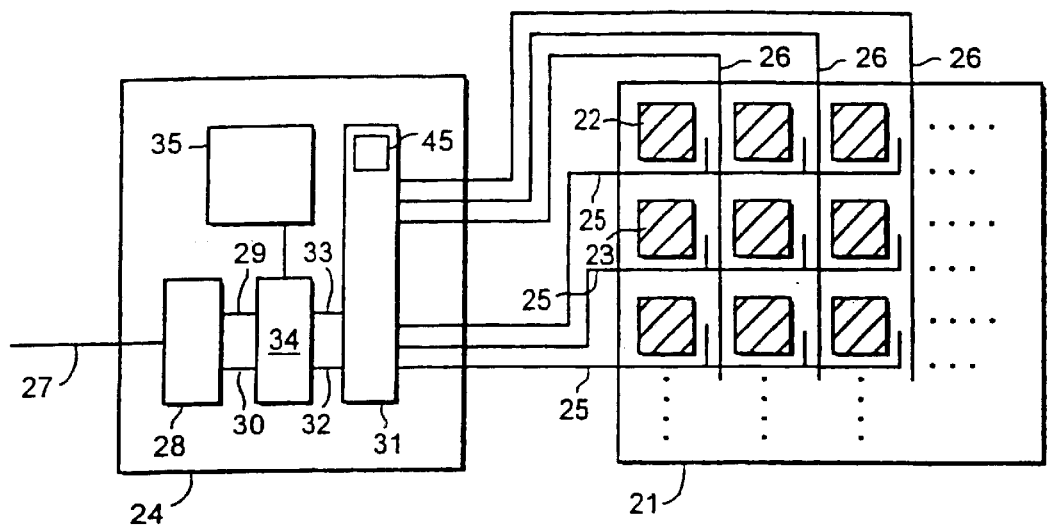
FIG. 6 shows a schematic diagram of a multi-pixel device and its control apparatus.

FIG. 6 shows schematically an example implementation of a completed device 21 having numerous pixels 22, 23 etc. arranged in rows and columns, and each divided into a number of independently controllable light-emitting areas as illustrated in FIGS. 3 to 5. A control unit 24 is connected to the scan 25 and signal 26 lines and capable of controlling the voltage of each. The control unit receives display signals at 27 (e.g. from a. personal computer) and comprises a processing means 28 for decoding those signals into real-time brightness information for each pixel of the display. The processor 28 outputs address information on line 29 identifying each pixel in turn and brightness information on line 30 for that pixel. The brightness information could typically be: a number from zero to, say, 16 or 64 giving the desired brightness of the pixel. The control unit includes an addressing switch unit 31 which receives address information at 32 identifying a pixel and brightness information at 33, addresses the identified pixel by selecting the scan and signal lines at whose intersection the pixel lies and applies appropriate voltages to the scan and signal lines each to store on that pixel's storage capacitor the charge required to turn the pixel on to the desired brightness as indicated on line 33. The control unit or any part of it could be formed on the backplane of the display itself.

In the prior art device of FIG. 1, in which pixels are driven in the transition region of their current transistors, the addressing switch 31 could receive addressing and brightness information directly from the processor 28. In the present exemplary embodiment of the present invention there is however an intermediate processor 34 between the processor 28 and the switch unit 31. The intermediate processor receives the brightness information for each pixel from processor 28 by lines 29 and 30 and stores the desired brightness of each pixel in memory 35. The intermediate processor then controls the addressing switch unit to fix the brightness of the pixels in one or both of two ways.

Figure 2:
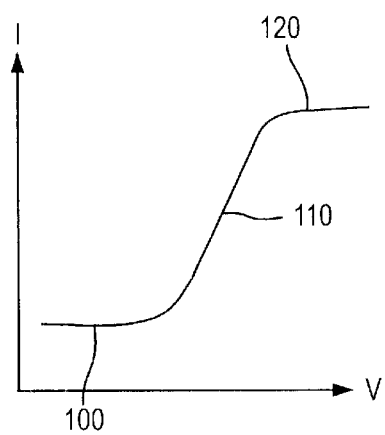
FIG. 2 shows a graph of current through a transistor against gate voltage of the transistor.

The first way of fixing the brightness is by turning the pixels on and off rapidly with a duty cycle that achieves the desired brightness from each pixel when averaged over time (for the duration of a cycle). For instance, if half-brightness is desired (e.g. a brightness of 32 in the 64 grey-scale scheme mentioned above) the pixel is switched so as to be fully on for half of the time and fully off for half of the time. An impression of flickering can be avoided by switching the pixel rapidly between its on and, off states. A suitable switching frequency to give a viewer an impression of constant light output from the device is 30 to 50 Hz or more. The brightness values output by the intermediate processor 34 on line 33 indicate either fully on or fully off; intermediate values need not be used. Therefore, the current transistors of the pixels of the device are always (apart from transiently during turn-on and turn-off) operating in the predictable, flat on and off regions shown in FIG. 2, and the brightnesses of the pixels can more easily be made consistent.

Figure 7:
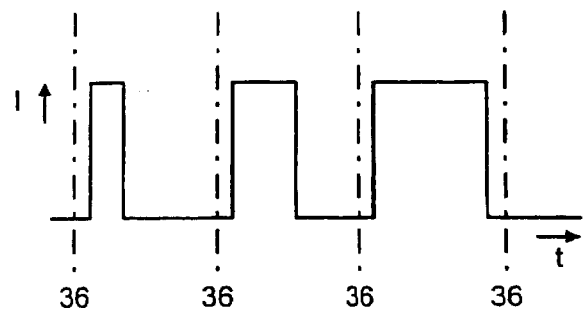
FIGS. 7 and 8 show plots of current through a pixel against time.
Figure 8:
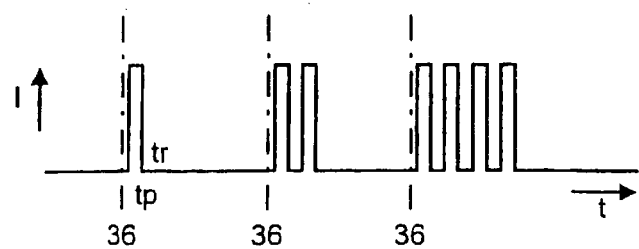

A number of detailed drive schemes could be used to achieve the desired brightness of each pixel. For instance, the pixel could (except when it is desired to be at full or zero brightness) be turned on once and off once in each cycle, with the time between the on and off switching chosen to achieve the required duty cycle (see FIG. 7), or more than once (see FIG. 8). FIG. 8 shows a plot of applied current against time for a single pixel. The lines 36 separate cycles of the drive scheme. During the three cycles shown in FIG. 8 the brightness of the pixel is increased from around 10% to around 40%. The on-time of the pixel is applied as a series of pulses of equal length $t_p$ which, when added together, give the total on-time per cycle needed to achieve the required duty cycle. With the total on-time per cycle kept the same, the pattern of current between the on time and the off time can be varied to suit other requirements—e.g. to reduce flicker or cross-talk.

The second way to fix the brightness is to make use of the fact that the separate lightemitting areas of each pixel can be individually controlled. The brightness of the pixel can be controlled by switching on one or more of the lightemitting areas. As before, the brightness is controlled by control unit 24. The addressing switch 31 again receives address information on line 32 identifying each pixel in turn and brightness information on line 33 for that pixel. This time the brightness information has a value from 0 to 16, indicating the desired brightness. The addressing switch 31 includes a multi-area processor 45 which receives the address information for, say, the pixel shown in FIGS. 3 to 5, identifies the scan and signal lines needed to address the individual light-emitting areas of that pixel and based on the brightness value received at 33 applies the appropriate voltages to those lines to turn none, one, two three or all of the light-emitting areas of the pixel fully on so as to achieve the desired brightness. Those selected areas can be left fully on until the brightness of the pixel is to be changed.

The light-emifting areas into which each pixel is divided could be of the same size or of different sizes. One useful division is, where the pixel is to be divided into n light-emitting areas, for the sizes of those areas to be $1/(2^n-1)$, $2/(2^n-1)$, $4/(2^n-1)$, ..., $(2^{(n-1)})/(2^n-1)$ of the full size of the pixel. This arrangement provides $2^n$ grey-scale values from those n pixels. For example, in FIG. 3 the area of light-emitting area 19d is twice that of area 19c, which is twice that of area 19b, which is twice that of area 19a.

The light-emitting areas could be defined as parallel strips running across the pixel, as in FIG. 3, or in other ways.

To achieve even more grey-scales the two ways of controlling brightness described above could be combined, so that a device having subdivided pixels of the type shown in FIGS. 3 to 5 is driven by a pulsed drive scheme as described with reference to FIG. 7 or 8. Either or both of those two ways of controlling brightness could also be combined with voltage control, as described with reference to FIG. 1, where the voltage applied to each light-emitting area is also capable of being varied to a level that is not fully on or off, to give even more available grey levels. For example, in a device with each pixel divided into four areas as shown in FIG. 3, driven with one of sixteen available drive schemes as shown in FIG. 7, where the peak voltage is chosen from one of 16 levels, 4096 grey levels are available.

A pulsed drive scheme could be applied to a device having unitary pixels, rather than the sub-divided pixels of the device of FIGS. 3 to 5.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

What is claimed is:

1. An organic light-emitting device having:
   an organic light emitting region comprising a plurality of organic light-emitting pixels;
   first switch means associated with a respective pixel for switching power to that pixel; and
   drive means for driving each switch means between a first, low power mode and a second, high power mode, at a frequency sufficient to cause light emission from the associated pixel to appear substantially continuous, the duration of the high power mode relative to the low power mode being variable so as to vary the average brightness of the pixel over the duration of a cycle, wherein in each cycle the high power mode is provided as more than one discrete high power pulse.

2. An organic light-emitting device as claimed in claim 1, wherein in the first mode the pixel is substantially non-emissive.

3. An organic light-emitting device as claimed in claim 1, wherein the switch means comprises a transistor switch for switching the power supplied to the pixel.

4. An organic light-emitting device as claimed in claim 3, wherein in the second mode the transistor of said transistor switch is in a fully on state.

5. An organic light-emitting device as claimed in claim 3, wherein in the second mode the transistor of said transistor switch is in a fully off state.

6. An organic light-emitting device as claimed in claim 3, wherein the drive means is capable of driving the switch means to a non-instantaneous partially on state.

7. An organic light-emitting device as claimed in claim 1, wherein the switch means comprises a thin-film transistor switch.

8. An organic light-emitting device as claimed in claim 1, wherein the drive means drives each switch means to cycle between the first mode and the second mode at a frequency of at least 30 Hz.

9. An organic light-emitting device as claimed in claim 1, wherein each pixel comprises at least two independent light-emitting areas, and comprising second switch means each associated with a respective one of the light-emitting areas for independently switching power to that light-emitting area under the control of the drive means.

10. An organic light-emitting device as claimed in claim 9, wherein the light-emitting areas of each pixel are of different areas.

11. An organic light-emitting device as claimed in claim 1, wherein the organic light-emitting pixels are formed of a light-emitting polymer material.

12. An organic light-emitting device as claimed in claim 1, wherein the organic light-emitting pixels are formed of a light-emitting conjugated material.

13. An organic light-emitting device as claimed in claim 1, wherein the organic Alight-emitting pixels are formed of poly(p-phenylenevinylene) or a derivative thereof.

14. An organic light-emitting device as claimed in claim 1, wherein each pixel is deposited by ink-jet printing.

15. An organic light-emitting device comprising:
   an organic light-emitting region comprising a plurality of organic light-emitting pixels, each pixel comprising at least two independent light-emitting areas, wherein the light-emitting areas are of different areas;
   a switch arrangement associated with each pixel and comprising switch means each associated with a respective light-emitting area of that pixel for switching power to that light-emitting area;
   a control means for addressing each pixel by its associated switch arrangement and controlling the brightness of each pixel by selectively driving one or more of the corresponding switch means to cause selected ones of the light-emitting areas of that pixel to emit light.

16. An organic light-emitting device as claimed in claim 15, wherein the organic light-emitting areas are formed of poly(p-phenylenevinylene) or a derivative thereof.

17. An organic light-emitting device as claimed in claim 15, wherein each organic light-emitting area is deposited by ink-jet printing.

18. An organic light-emitting device as claimed in claim 15, wherein the organic light-emitting areas are formed of a light emitting polymer material.

19. An organic light-emitting device as claimed in claim 15, wherein the organic light-emitting areas are formed of a light-emitting conjugated material.

* * * * *

UNITED STATES PATENT AND TRADEMARK OFFICE
CERTIFICATE OF CORRECTION

PATENT NO.      : 6,429,601 B1
DATED           : August 6, 2002
INVENTOR(S)     : Friend et al.

It is certified that error appears in the above-identified patent and that said Letters Patent is hereby corrected as shown below:

<u>Title page,</u>
Item [73], please insert after "(GB)" -- and Seiko Epson Corporation, Nagano-ken (JP) --.
Item [30], please delete "9803441" and insert -- 9803441.6 -- therefor.

<u>Column 9,</u>
Line 17, please delete "Alight-emitting" and insert -- light-emitting -- therefor.

Signed and Sealed this

Eighteenth Day of February, 2003

JAMES E. ROGAN
*Director of the United States Patent and Trademark Office*